United States Patent
Ibarra et al.

(10) Patent No.: US 10,236,896 B1
(45) Date of Patent: Mar. 19, 2019

(54) REDUCING TRANSIENT RESPONSE IN A PHASE-LOCKED LOOP CIRCUIT

(71) Applicant: MOTOROLA SOLUTIONS, INC., Chicago, IL (US)

(72) Inventors: Christian Ibarra, Weston, FL (US); Jiun How Ng, Sunrise, FL (US)

(73) Assignee: MOTOROLA SOLUTIONS, INC., Chicago, IL (US)

(*) Notice: Subject to any disclaimer, the term of this patent is extended or adjusted under 35 U.S.C. 154(b) by 0 days.

(21) Appl. No.: 15/918,938

(22) Filed: Mar. 12, 2018

(51) Int. Cl.
*H03L 7/089* (2006.01)
*H03L 7/18* (2006.01)
*H03L 7/107* (2006.01)

(52) U.S. Cl.
CPC .......... *H03L 7/0893* (2013.01); *H03L 7/1072* (2013.01); *H03L 7/18* (2013.01)

(58) Field of Classification Search
None
See application file for complete search history.

(56) References Cited

U.S. PATENT DOCUMENTS

| | | |
|---|---|---|
| 5,384,551 A | 1/1995 | Kennedy et al. |
| 5,757,238 A | 5/1998 | Ferraiolo et al. |
| 5,874,863 A | 2/1999 | Wojewoda et al. |
| 5,889,829 A | 3/1999 | Chiao et al. |
| 6,545,547 B2 | 4/2003 | Fridi et al. |
| 7,170,322 B2 | 1/2007 | Gonzalez et al. |
| 7,504,893 B2 | 3/2009 | Gonzalez et al. |
| 9,608,649 B2 * | 3/2017 | Ek .................. H03L 7/087 |

\* cited by examiner

*Primary Examiner* — Jeffery S Zweizig
(74) *Attorney, Agent, or Firm* — Michael Best & Friedrich LLP

(57) ABSTRACT

Reducing transient response in a phase-locked loop circuit. In one instance, a system including a phase detector; a cycle slip detector; and a charge pump electrically connected to the phase detector is provided. The charge pump includes an adapt mode charge pump configured to bypass the phase detector with the cycle slip detector when a frequency error surpasses a first error threshold and an instantaneous frequency surpasses a desired frequency threshold. The charge pump also includes an adapt mode, programmable trickle current source configured to provide a ramp-up trickle current to the phase-locked loop circuit.

20 Claims, 6 Drawing Sheets

US 10,236,896 B1

REDUCING TRANSIENT RESPONSE IN A PHASE-LOCKED LOOP CIRCUIT

BACKGROUND OF THE INVENTION

Phase-locked loop circuits are used in high-speed communication devices to generate a continuous wave signal at a precise and stable frequency. Phase-locked loop circuits generally include a reference frequency, a synthesizer, and a voltage-controlled oscillator. A known synthesizer used in phase-locked loop circuits is a fractional N synthesizer. As its name suggests, a fractional N synthesizer which utilizes fractional levels of the reference frequency to synthesize an output frequency.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
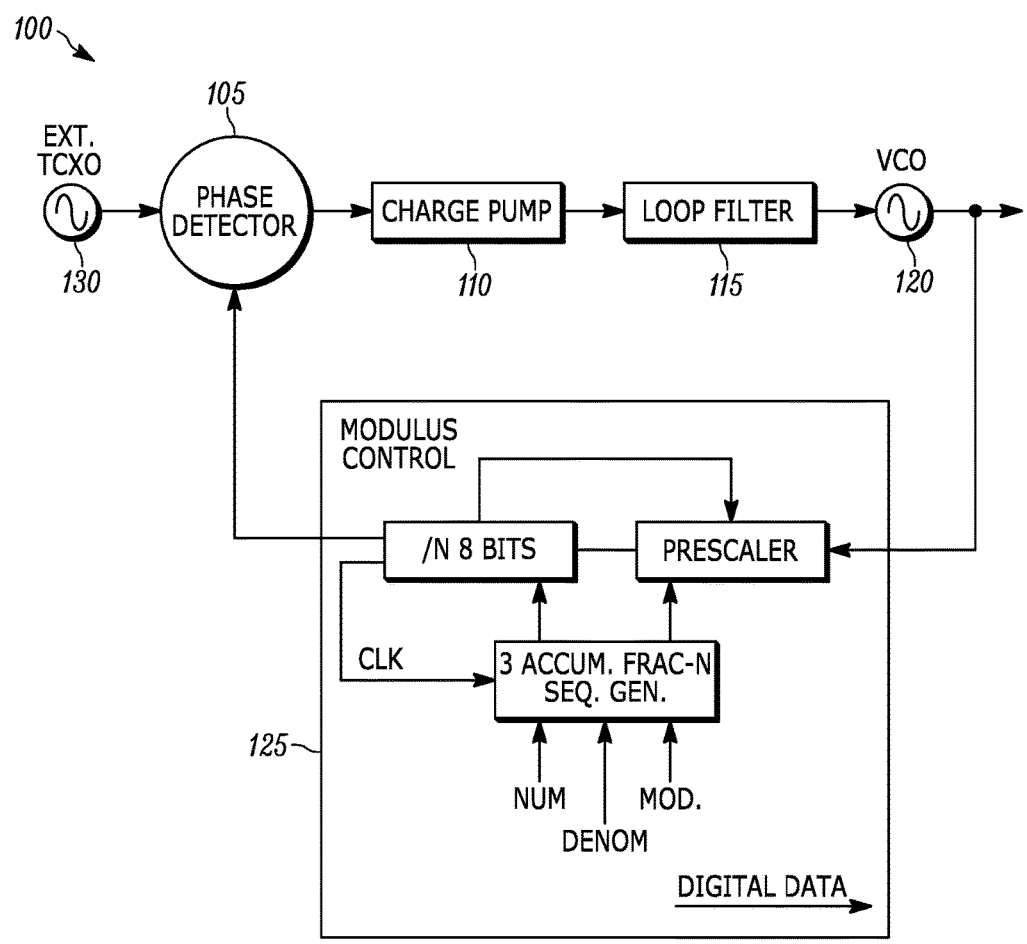
FIG. 1 is a diagram of a single phase-locked loop circuit in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

A phase-locked loop or PLL circuit generates a high-frequency output signal based on an input signal. When a PLL circuit's reference clock and PLL feedback clock are frequency and phase matched, the PLL circuit is said to be "locked." Reducing lock time in a phase-locked loop circuit is important to the design of high-speed communication devices. Reduction of lock time requires reducing transient responses occurring in the phase-locked loop circuit. One technique for reducing lock time includes the use of a regular speed ("normal") charge pump and a faster speed ("adapt") charge pump in a fractional N synthesizer to provide for faster signal acquisition.

A single phase-locked loop architecture with wide loop bandwidth has been developed in order to speed the transient response. Currently, circuits with this architecture include a constant trickle current that is used to eliminate "dead zones" (frequencies or phases that do not allow the circuit to operate correctly) in a phase detector. However, when transitioning from a high frequency to a low frequency, the transition will be slowed down, as the trickle current constantly charges the circuit even as it needs to be discharged. While the slowdown is not significant for systems with longer lock times, for systems with shorter lock times, the slowdown is a larger factor.

As a consequence, embodiments described and taught herein provide, among other things, systems and methods for reducing transient responses occurring in phase-locked loop circuits. One example provides a phase-locked loop circuit that includes a phase detector, a cycle slip detector, and a charge pump electrically connected to the phase detector. The charge pump has an adapt mode charge pump configured to bypass the phase detector when a frequency error surpasses a first error threshold and an instantaneous frequency surpasses a desired frequency threshold. The charge pump also has an adapt mode, programmable trickle current source configured to provide a ramp-up trickle current to the phase-locked loop circuit to reduce transient response time.

Another example provides a method of controlling a phase-locked loop circuit. The method includes bypassing, with a cycle slip detector, a phase detector when a frequency error surpasses a first error threshold. The method also includes producing, with the cycle slip detector, an up clock pulse or a down clock pulse based upon an instantaneous frequency. The method also includes providing, with an adapt mode, programmable trickle current source, a ramp-up trickle current to the phase-locked loop circuit.

FIG. 1 is a schematic of a single phase-locked loop circuit 100 in accordance with some embodiments of the invention. In the example illustrated, the single phase-locked loop circuit 100 includes a phase detector 105, a charge pump 110, a loop filter 115, a voltage-controlled oscillator 120, and a loop divider 125.

The phase detector 105 detects a difference in phase between two signal inputs. For example, the phase detector 105 detects a difference in phase between a reference frequency (provided by reference frequency source 130) and a feedback frequency received from the loop divider 125 (described in greater detail below). During normal operation of the single phase-locked loop circuit 100, the phase detector 105 produces up (UP) and down (DOWN) signals based upon the difference of phase between the reference frequency and feedback frequency.

The phase detector 105 is electrically coupled or otherwise electrically connected to the charge pump 110 and is configured to provide the UP and DOWN signals to the charge pump 110.

Figure 2:
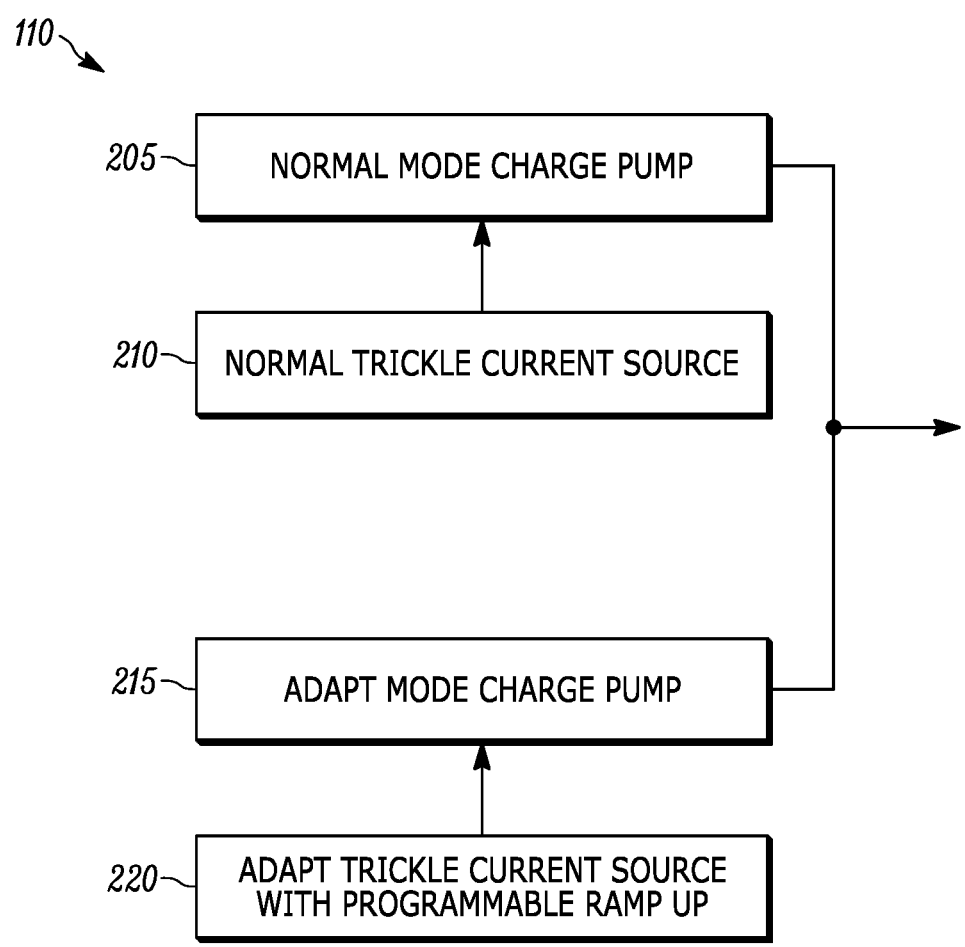
FIG. 2 is a diagram of a charge pump in accordance with some embodiments.

The charge pump 110 is illustrated in greater detail in FIG. 2. In the example illustrated, the charge pump 110 includes a normal mode charge pump 205, and a normal mode trickle current source 210 electrically coupled to the normal mode charge pump 205. The charge pump 110 also includes an adapt mode charge pump 215, and an adapt mode trickle current source 220 electrically coupled to the adapt mode charge pump 215. The normal mode trickle current source 210 provides, via the normal mode charge pump 205, a trickle current to the loop filter 115 during normal operation of the charge pump 110. By providing the normal mode trickle current to the loop filter 115, the phase detector 105 avoids a "dead zone," or a frequency that does not allow the single phase-locked loop circuit 100 to operate correctly.

The adapt mode trickle current source 220 provides, via the adapt mode charge pump 215, a ramp-up trickle current to the loop filter 115. Applying the ramp-up current allows for a smoother transition to the desired frequency (as explained below in more detail). The adapt mode trickle current source 220 may be programmable (for example, an amount of trickle current provided by the adapt mode trickle current source 220 is variable and not just a preset value). For example, the adapt mode trickle current source 220 may be configured to receive, from a user input device, an amount of ramp-up trickle current to provide when the charge pump 110 is operating in the adapt mode. The adapt mode charge pump 215 is configured to source or sink a current to a capacitor of the loop filter 115. The ramp-up trickle current applied by the adapt mode charge pump 215 enables the adapt mode charge pump 215 to lock on to a desired frequency by either slowing down the adapt mode charge pump 215 (when transitioning from high to low frequencies) or speeding up the adapt mode charge pump 215 (when transitioning from low to high frequencies).

The charge pump 110 may function in a normal mode or an adapt mode. In one example, the charge pump 110 operates in the adapt mode when frequencies are being transitioned. Otherwise, the charge pump 110 functions in the normal mode.

Returning to FIG. 1, the single phase-locked loop circuit 100 also includes the loop filter 115, which is electrically coupled to the charge pump 110 and the voltage-controlled oscillator 120. An output signal from the charge pump 110 (for example, a trickle current) is received by the loop filter 115, which generates a filtered signal. The filtered signal is provided to the voltage-controlled oscillator 120. In some embodiments, the loop filter 115 is a low-pass filter. In some instances, the loop filter 115 includes at least one capacitor that is charged or discharged by the charge pump 110. The loop filter 115 may include other filtering components.

The voltage-controlled oscillator 120 outputs a signal with a frequency based upon the filtered signal from the loop filter 115. The voltage-controlled oscillator 120 then outputs a signal including a frequency. This signal may be output to a transmission component (for example, an antenna). In addition, the voltage-controlled oscillator 120 is electrically coupled to the loop divider 125 and the signal output by the voltage-controlled oscillator 120 is also sent to the loop divider 125.

The loop divider 125 is configured to receive the signal output by the voltage-controlled oscillator 120. The loop divider 125 divides the signal by a value of N to create a divided signal with a divided frequency (the feedback frequency) and then sends the divided signal back to the phase detector 105. The phase detector 105 compares the feedback frequency to the reference frequency. If the reference frequency phase and the feedback frequency phase are equal, the single phase-locked loop circuit 100 is considered to be in a "locked state."

If the feedback frequency and the reference frequency do not have equal phase, the phase detector 105, the phase detector 105 sends a signal to the charge pump 110 to charge or discharge the loop filter 115 (for example, to charge or discharge a capacitor of the loop filter 115). In one embodiment, the phase detector 105 determines a difference in phase between the reference frequency and the feedback frequency.

The phase detector 105 may determine that the difference in phase is above an error threshold. In one example, the phase detector 105 does not send a signal to the charge pump 110 to charge or discharge the loop filter 115 unless the phase difference between the feedback frequency and the reference frequency is above $0.5\pi$. The error threshold may be set by a user through an input device.

In one example, when the phase of the reference frequency and the phase of the feedback frequency differ by more than $2\pi$, a "cycle-slip" has occurred. A cycle-slip is a discontinuity in a receiver's (in this case, the phase detector 105) continuous phase lock on a remote signal. However, if the phase detector 105 receives the two signals when a cycle-slip occurs, the phase detector 105 may incorrectly determine to stop providing a signal to the charge pump 110 to charge or discharge the loop filter 115 and cause delay in acquiring the desired output frequency and/or undershoot or overshoot the desired output frequency.

To help prevent the phase detector 105 from prematurely exiting a fast acquisition mode (a mode where the charge pump 110 provides current to the loop filter 115 to rapidly acquire the desired output frequency), the single phase-locked loop circuit 100 includes a cycle slip detector and a state machine. In an embodiment that includes the cycle slip detector and a state machine, the error threshold for the difference in phase is, for example, $2\pi$.

Figure 3:
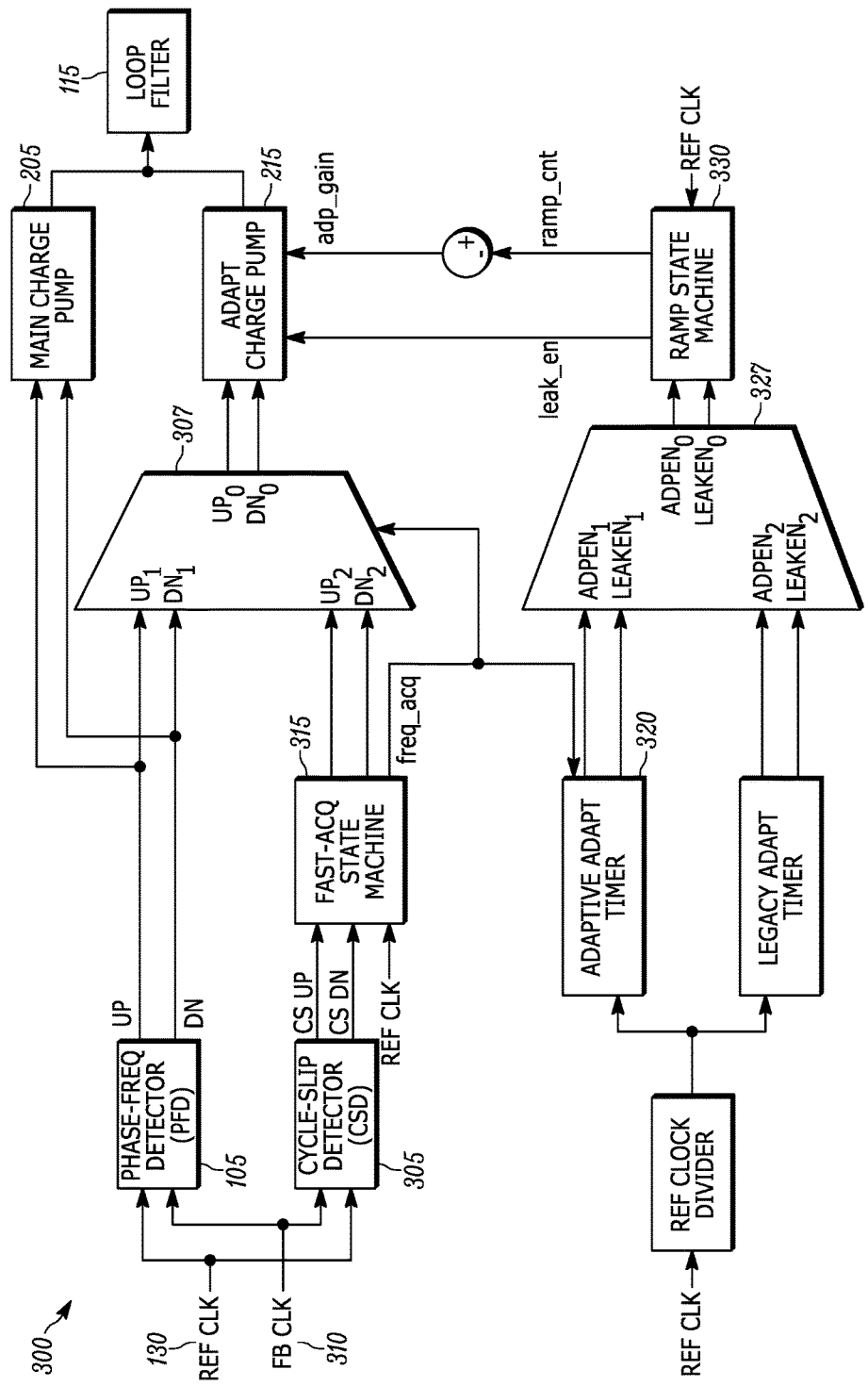
FIG. 3 is a diagram of a portion of a single phase-locked loop circuit in accordance with some embodiments.

A portion 300 of the single phase-locked loop circuit 100 is illustrated in the block diagram in FIG. 3. The portion 300 includes the phase detector 105, the normal mode charge pump 205 of the charge pump 110, the adapt mode charge pump 215 of the charge pump 110, and the reference frequency source 130. The portion 300 also includes a cycle slip detector 305 electrically connected to the reference frequency source 130 and a feedback frequency signal source 310.

During operation of the single phase-locked loop circuit 100, the phase detector 105 sends UP or DOWN clock signals to the normal mode charge pump 205 and to a charge pump multiplexer 307. For example, while the single phase loop lock circuit is not changing frequencies, the normal mode charge pump 205 is receiving UP or DOWN clock pulses from the phase detector 105. The charge pump multiplexer 307 further receives the UP or DOWN clock pulses, but as the cycle slip detector 305 is not active and a control signal is not provided to the charge pump multiplexer 307 (as discussed below), the charge pump multiplexer 307 has a low output signal to the adapt mode charge pump 215.

An UP clock pulse indicates that the instantaneous frequency (the frequency currently being output by the voltage-controlled oscillator 120) is lower than the desired frequency. A DOWN clock pulses indicates that the instantaneous frequency is currently higher than the desired frequency.

In some embodiments, even if the cycle slip detector 305 is not activated by a cycle slip, the charge pump multiplexer 307 may output a high signal to activate the adapt mode charge pump 215 to source or sink a current, including sourcing an adapt mode trickle current, to the loop filter 115.

The cycle slip detector 305 determines when a cycle slip has occurred by comparing the phase of the reference frequency signal from the reference frequency source 130 and the phase of the feedback frequency signal from the feedback frequency signal source 310 (which comes from the loop divider 125). If a cycle slip is detected, the cycle slip detector 305 sends an UP or DOWN cycle slip clock pulse to a fast acquire state machine 315. The period of the UP or DOWN cycle slip clock pulses is proportional to the frequency error between the reference frequency and the feedback frequency.

Figure 4:
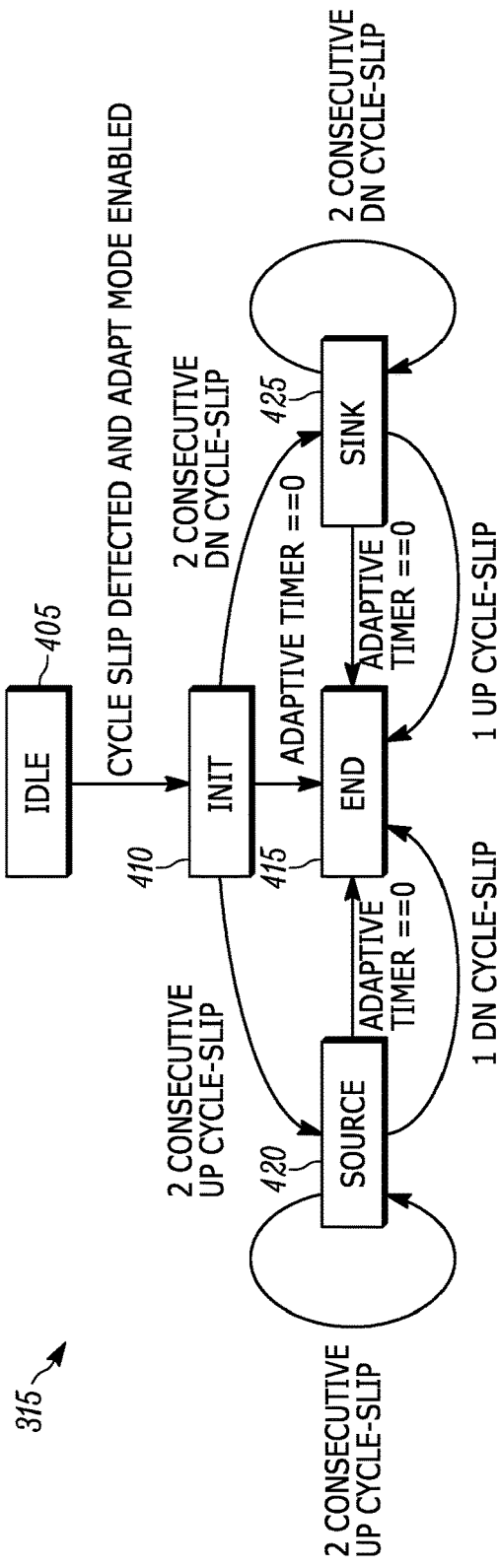
FIG. 4 is a diagram of a fast acquire state machine in accordance with some embodiments.

The fast acquire state machine 315 is illustrated in the block diagram of FIG. 4. The fast acquire state machine 315 is in an idle state (IDLE state) (block 405) until the cycle slip detector 305 detects two consecutive cycle slips. Instead of only detecting one cycle slip (which may be an error and not a true cycle slip), detecting two cycle clips allows for error checking. Error checking helps prevent or reduce the likelihood of 1) a false positive from occurring and 2) enabling the adapt mode charge pump 215 when the adapt mode charge pump 215 should not be enabled.

The fast acquire state machine 315 enters an initial state (INIT state) (block 410) when two consecutive clock slips are detected by the cycle slip detector 305. When the fast acquire state machine 315 enters the INIT state, a fast acquire timer is started. The fast acquire state machine 315 then waits for further consecutive cycle slips from the cycle slip detector 305. If the cycle slip detector 305 does not send consecutive cycle slips in the same direction (for example, two consecutive UP cycle slips or two consecutive DOWN cycle slips) to the fast acquire state machine 315, the fast acquire timer will continue to count down. If the fast acquire timer reaches zero, the fast acquire state machine 315 will transition to an end state (END state) (block 415). The fast acquire state machine 315 also sends a signal to the charge pump multiplexer 307 to ignore up and down clock pulses from the phase detector 105.

If the fast acquire state machine 315 receives two consecutive UP cycle slips from the cycle slip detector 305, the fast acquire state machine 315 transitions to the SOURCE state (block 420). While in the SOURCE state (block 420), the fast acquire state machine 315 sends a signal to take clock pulse control from the phase detector 105 and to give clock pulse control to the cycle slip detector 305. The fast acquire state machine 315 then sends a signal to restart the fast acquire timer count.

The fast acquire state machine 315 also sends a signal to an UP input on the charge pump multiplexer 307 to source or provide a current from the adapt mode charge pump 215 into the loop filter 115. The fast acquire state machine 315 stays in the SOURCE state (block 420) until it receives a cycle slip pulse in the DOWN direction or until the fast acquire timer reaches zero. Once one of these two conditions has been met, the fast acquire state machine 315 proceeds to the END state (block 415). If the fast acquire state machine 315 receives a further two UP cycle slips, the fast acquire timer is reset and begins counting down again.

If the fast acquire state machine 315 receives two consecutive DOWN cycle slips from the cycle slip detector 305, the fast acquire state machine 315 proceeds to a sink state (SINK state) (block 425). While in the SINK state (block 425), the fast acquire state machine 315 sends a signal to take clock pulse control from the phase detector 105 and give clock pulse control to the cycle slip detector 305. The fast acquire state machine 315 then sends a signal to restart the fast acquire timer count.

The fast acquire state machine 315 also sends a signal to a DOWN input on the charge pump multiplexer 307 to indicate to sink a current from the loop filter 115 using the adapt mode charge pump 215. The fast acquire state machine 315 stays in the SINK state (block 425) until it receives a cycle slip pulse in the UP direction or until the fast acquire timer reaches zero. Once one of these two conditions has been met, the fast acquire state machine 315 transitions to the END state (block 415). If the fast acquire state machine 315 receives a further two DOWN cycle slips, the fast acquire timer is reset and begins counting down again.

When the fast acquire state machine 315 enters the END state (block 415), the fast acquire state machine 315 sends a signal to give clock pulse control back to the phase detector 105 from the cycle slip detector 305. The fast acquire state machine 315 may then return to the IDLE state (block 405) and await the cycle slip detector 305 to re-enable the fast acquire state machine 315 after two consecutive cycle slips.

In some embodiments, the fast acquire timer is restarted every time the fast acquire state machine 315 receives two consecutive cycle slips in the same direction.

Returning to FIG. 3, the fast acquire state machine 315 sends a control signal to the charge pump multiplexer 307. In addition, the fast acquire state machine 315 also sends a signal to an adaptive timer 320.

The adaptive timer 320 is configured to receive the signal from the fast acquire state machine 315 and begin counting down to a constant value from an initial starting value, which may be based upon a reference clock of the single phase-locked loop circuit 100. Once the adaptive timer 320 reaches a threshold value (which may be set in response to a user input from an input device), the adaptive timer 320 sends a signal to a ramp-up multiplexer 327 to provide a ramp-up trickle current to the loop filter 115 (as described below).

Figure 5:
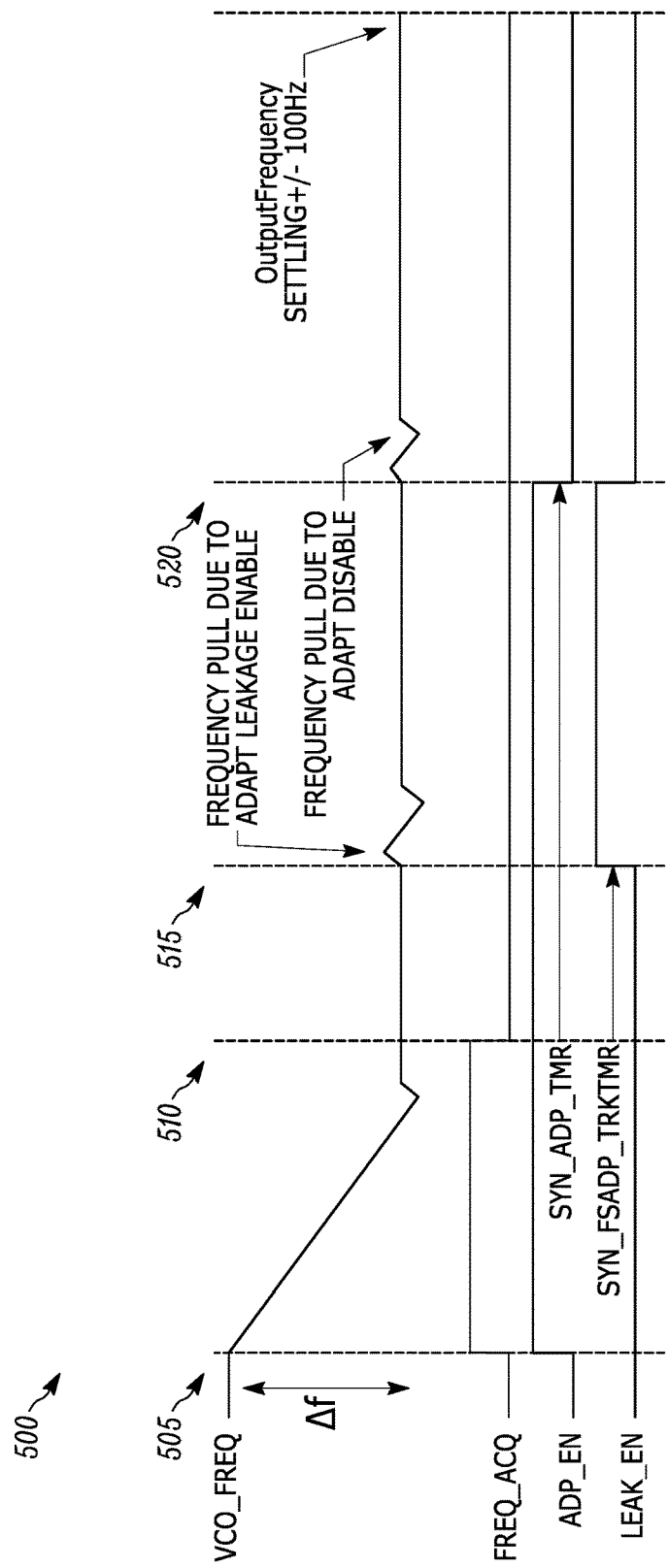
FIG. 5 is a timing diagram of an adaptive timer in accordance with some embodiments.

An example timing diagram 500 for the adaptive timer 320 is illustrated in FIG. 5. The timing diagram 500 illustrates the timing of the adaptive timer 320 during a transition between desired frequencies ($\Delta f$) using the charge pump 110.

At time 505, a frequency acquire signal (FREQ_ACQ) and an adaptive mode enable signal (ADP_EN) turn on. The frequency transition $\Delta f$ begins at time 505. The output frequency from the voltage-controlled oscillator 120 (VCO_FREQ) begins to change as the signals are all enabled. The adapt mode charge pump 215 begins to charge or discharge (source or sink current to) a capacitor of the loop filter 115 to reach a desired frequency (for example, a lock frequency). The desired frequency may be set in response to a user input by a user.

At time 510, the frequency acquire signal turns off and the adaptive timer 320 (ADP_TMR) begins to count down. At time 510, the fast acquire mode turns off and the desired frequency holds relatively steady. The adapt mode charge pump 215 continues to sink or source current after 510.

At time 515, the adapt mode charge pump 215 receives a signal (LEAK_EN) to provide a ramp-up trickle current from the adapt mode trickle current source 220. By applying a ramp-up trickle current instead of a constant trickle current, the adapt mode charge pump 215 prevents overshoot of the desired frequency when trickle current is applied. This prevents delay (which is caused by a constant trickle current) and therefore allows the single phase-locked loop circuit 100 to reach a locked state in a shorter amount of time. An amount of ramp-up trickle current, an amount of time for the ramp-up trickle current to reach full charging amount, and a time when the ramp-up trickle current is turned on may all be set in accordance with a user input from an input device. In some embodiments, time 515 occurs only after the frequency error is below the frequency error threshold.

At time 520, the desired frequency is reached and the adapt mode charge pump 215 turns off, and the desired frequency is reached.

Returning to FIG. 3, the portion 300 also includes a ramp state machine 330. The ramp state machine 330 receives output from the ramp-up multiplexer 327 indicating when to turn on, how long to stay on, how quickly to ramp up the trickle current, and other values related to the adapt mode trickle current source 220 and/or the adapt mode charge pump 215.

Figure 6:
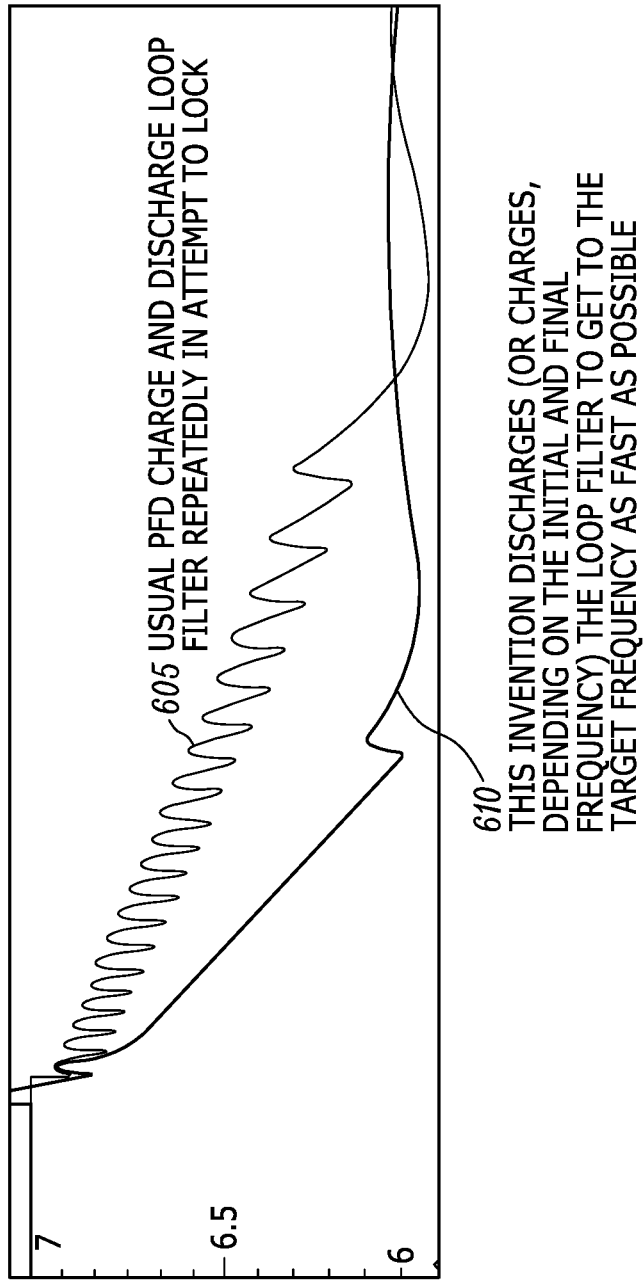
FIG. 6 is a diagram illustrating an effect a cycle slip detector and a ramp-up trickle current has on a single phase-locked loop circuit in accordance with some embodiments.

FIG. 6 illustrates how the cycle slip detector 305 affects the single phase-locked loop circuit 100. Signal 605 represents a signal produced by the phase-locked loop circuit 100 when the cycle slip detector 305 is not used. Instead, the phase detector 105 repeatedly charges and discharges the loop filter 115 in an attempt to reach a locked state. In contrast, signal 610 illustrates what occurs when the cycle slip detector 305 is used. Instead of constantly switching between charging and discharging, the cycle slip detector 305 allows the single phase-locked loop circuit 100 to rapidly charge or discharge (for example, enter an adapt mode or fast acquire mode) to reach the desired frequency and a final locked state in shorter amount of time by bypassing the phase detector 105.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A phase-locked loop circuit, comprising:
   a phase detector;
   a cycle slip detector; and
   a charge pump electrically connected to the phase detector and having
      an adapt mode charge pump configured to bypass the phase detector with the cycle slip detector when a frequency error surpasses a first error threshold and an instantaneous frequency surpasses a desired frequency threshold, and
      an adapt mode, programmable trickle current source configured to provide a ramp-up trickle current to the phase-locked loop circuit.

2. The phase-locked loop circuit of claim 1, wherein the desired frequency threshold is a threshold lower than a desired frequency and the cycle slip detector produces an up clock pulse when the frequency error is above the first error threshold and the instantaneous frequency is lower than the desired frequency threshold.

3. The phase-locked loop circuit of claim 2, wherein the adapt mode, programmable trickle current source provides, after the frequency error is below the first error threshold and a first predetermined period of time, the ramp-up trickle current to a loop filter to charge at least one capacitor of the loop filter.

4. The phase-locked loop circuit of claim 3, wherein the adapt mode, programmable trickle current source stops providing, after a second predetermined period of time, the ramp-up trickle current.

5. The phase-locked loop circuit of claim 1, wherein the desired frequency threshold is a threshold higher than a desired frequency and the cycle slip detector produces a down clock pulse when the frequency error is above the first error threshold and the instantaneous frequency is higher than the desired frequency threshold.

6. The phase-locked loop circuit of claim 5, wherein the adapt mode charge pump discharges a capacitor of a loop filter to acquire a desired frequency.

7. The phase-locked loop circuit of claim 6, wherein the adapt mode, programmable trickle current source provides a trickle current to charge the capacitor of the loop filter to slow down the adapt mode charge pump and lock on to the desired frequency.

8. The phase-locked loop circuit of claim 7, wherein the adapt mode, programmable trickle current source stops providing, after a second predetermined period of time, the ramp-up trickle current.

9. The phase-locked loop circuit of claim 1, wherein the ramp-up trickle current is variable and an amount of the ramp-up trickle current provided by the adapt mode, programmable trickle current source is set in accordance to a user input received from an input device.

10. The phase-locked loop circuit of claim 1, wherein the cycle slip detector produces up or down clock pulses and a period of the up or down clock pulses is proportional to the frequency error.

11. The phase-locked loop circuit of claim 10, further comprising a timer, and wherein the timer is started when the cycle slip detector produces two up clock pulses consecutively or when the cycle slip detector produces two down clock pulses consecutively.

12. The phase-locked loop circuit of claim 11, wherein the timer is restarted if the cycle slip detector produces a further two up clock pulses after two consecutive up clock pulses or when the cycle slip detector produces a further two down clock pulses after two consecutive down clock pulses.

13. The phase-locked loop circuit of claim 1, wherein the first error threshold is variable and is set in accordance to a user input received from an input device.

14. The phase-locked loop circuit of claim 1, wherein the cycle slip detector bypasses the phase detector by ignoring a down clock pulse or an up clock pulse produced by the phase detector.

15. The phase-locked loop circuit of claim 1, wherein the charge pump includes a normal mode charge pump and a normal mode trickle current source.

16. The phase-locked loop circuit of claim 15, wherein the charge pump operates in either a normal mode or an adapt mode to transition frequencies.

17. A method of controlling a phase-locked loop circuit, the method comprising:
    bypassing, with a cycle slip detector, a phase detector when a frequency error surpasses a first error threshold;
    producing, with the cycle slip detector, an up clock pulse or a down clock pulse based upon an instantaneous frequency; and
    providing, with an adapt mode, programmable trickle current source, a ramp-up trickle current to the phase-locked loop circuit.

18. The method of claim 17, further comprising:
    charging, with an adapt mode charge pump, a capacitor of a loop filter, the charging occurring after two consecutive up clock pulses are produced by the cycle slip detector; and
    after the frequency error does not surpass the first error threshold, providing, with the adapt mode, programmable trickle current source, a trickle current to the capacitor of a loop filter, the providing of the trickle current occurring after a predetermined period of time.

19. The method of claim 17, further comprising:
    discharging, with an adapt mode charge pump, a capacitor of a loop filter, the discharging occurring after two consecutive down clock pulses are produced by the cycle slip detector; and
    after the frequency error does not surpass the first error threshold, providing, with the adapt mode, programmable trickle current source, a trickle current to the capacitor of a loop filter, the providing of the trickle current occurring after a predetermined period of time.

20. The method of claim 17, wherein the phase-locked loop circuit is controlled to transition frequencies when the adapt mode, programmable trickle current source provides the ramp-up trickle current to the phase-locked loop circuit.

* * * * *